United States Patent
Greenberg et al.

(10) Patent No.: US 6,429,500 B1
(45) Date of Patent: Aug. 6, 2002

(54) SEMICONDUCTOR PIN DIODE FOR HIGH FREQUENCY APPLICATIONS

(75) Inventors: David R. Greenberg, White Plains, NY (US); Kathryn T. Schonenberg, New Fairfield, CT (US); Seshadri Subbanna, Brewster; Keith M. Walter, Walkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 09/670,587

(22) Filed: Sep. 29, 2000

(51) Int. Cl.[7] ............... H01L 31/075; H01L 31/105; H01L 31/117
(52) U.S. Cl. ............... 257/458; 257/436; 257/461
(58) Field of Search ................ 257/458, 436, 257/461

(56) References Cited

U.S. PATENT DOCUMENTS

| | | |
|---|---|---|
| 3,982,267 A | 9/1976 | Henry |
| 4,660,008 A | 4/1987 | Henry et al. |
| 4,811,080 A | 3/1989 | Richards |
| 5,086,329 A | 2/1992 | Newman |
| 5,181,083 A | 1/1993 | Pezzani |
| 5,268,310 A | 12/1993 | Goodrich et al. |
| 5,343,070 A | 8/1994 | Goodrich et al. |
| 5,528,063 A | 6/1996 | Blanchard |
| 5,789,817 A | 8/1998 | Richards et al. |
| 5,877,037 A | 3/1999 | O'Keefe et al. |
| 5,886,374 A | 3/1999 | Sakamoto et al. |
| 6,008,527 A | * 12/1999 | Kasahara |
| 6,075,275 A | * 6/2000 | Irissou |
| 6,303,979 B1 | * 10/2001 | Kasahara |

FOREIGN PATENT DOCUMENTS

EP 576009 * 6/1992

* cited by examiner

Primary Examiner—Stephen D. Meier
(74) Attorney, Agent, or Firm—Connolly Bove Lodge & Hutz LLP.

(57) ABSTRACT

A microwave PIN diode having an increased intrinsic region volume for storing a charge. A semiconductor substrate has an N+ subcollector/cathode layer which encloses a region of the substrate. An N-skin formed over the interior of enclosed region. An Si layer is formed over the subcollector/cathode and N-skin to a thickness which defines the thickness for the intrinsic region of the diode. Implants are formed in the Si layer to permit contact with the subcollector/cathode layer. An anode is formed on the top of the Si layer. The total volume of the intrinsic region is increased by the N-skin which is positioned below the surface of the subcollector/cathode. The PIN diode may be formed as a lateral PIN diode thereby increasing the intrinsic region volume even further.

13 Claims, 6 Drawing Sheets

SEMICONDUCTOR PIN DIODE FOR HIGH FREQUENCY APPLICATIONS

FIELD OF THE INVENTION

The present invention relates to a PIN diode used in RF and microwave applications, and a method for making the PIN diode. Specifically, a PIN diode is disclosed having an increased intrinsic region volume for enhancing high frequency operation.

In the field of radio frequency communications, PIN diodes are used in many applications for switching radio frequency signals. For instance, in the cellular telephone art, transmit receive switches may be implemented using PIN diodes which alternately connect an antenna to either a transmitter or receiver section of a radio telephone. The PIN diodes operate in either an on, conducting condition, wherein there is a radio frequency path through the device, or an off non-conducting condition which effectively blocks any radio frequency signal transmission. Additionally, these devices can be used to switch between frequency sources in a cellular telephone application wherein multiple bands of frequency operation are provided. During the on conducting state of the PIN diode, the diode must remain in a stable conduction condition. The peak radio frequency voltage swings across the diode due to the RF signal should not affect the conduction of the device when either the on or off mode is selected.

The performance of the PIN diode is improved when the volume of the intrinsic region of the diode is increased. Increasing the volume, increases the charge storage capability for the PIN diode, rendering it slower to turn on and off, thereby making the device more stable and less susceptible to inadvertent switching due to high amplitude RF voltage swings.

An additional requirement for the design of the PIN diode is that it be compatible with the manufacturing processes used to implement other devices, such as bipolar transistors and FET devices, so that a variety of these devices may be manufactured using the same silicon manufacturing process.

SUMMARY OF THE INVENTION

A PIN diode, and a manufacturing process for implementing the diode, are provided having an increased intrinsic region volume. In accordance with one aspect of the invention, the intrinsic region volume is increased by creating a lateral PIN diode having an N+ subcollector region forming a cathode on a substrate. A silicon epi intrinsic layer is formed over the subcollector, and N+ implants are formed as connections to and extensions of the subcollector/cathode. A dielectric insulation region is deposited on the surface of the silicon epi layer adjacent to each of the implants. A P+ doped anode is grown over the dielectric insulation which maintains the anode out of contact with the implants, and provides a larger intrinsic region having an increased charge retention capability.

In accordance with another aspect of the invention, a subcollector-cathode region may have an opening under the anode portion connected by an N-skin. The N-skin increases the distance from the anode to the subcollector/cathode, so that a larger volume of charge may be accumulated in the intrinsic region.

In yet another aspect of the invention, the anode may be separated from the cathode implants by a shallow trench isolation (STI) structure located adjacent the N+ implants to provide a vertical PIN diode. The STI structure limits hole and electron conduction between the anode and implants N+, so that current conduction is essentially vertical.

DESCRIPTION OF THE DRAWINGS

FIG. 4a illustrates the step of forming the subcollector/cathode of FIG. 4;

FIG. 4b illustrates the formation of the N-skin of the subcollector/cathode;

FIG. 4c illustrates the formation of the dielectric insulation prior to growing the anode contact.

DESCRIPTION OF THE PREFERRED EMBODIMENT

Figure 1:
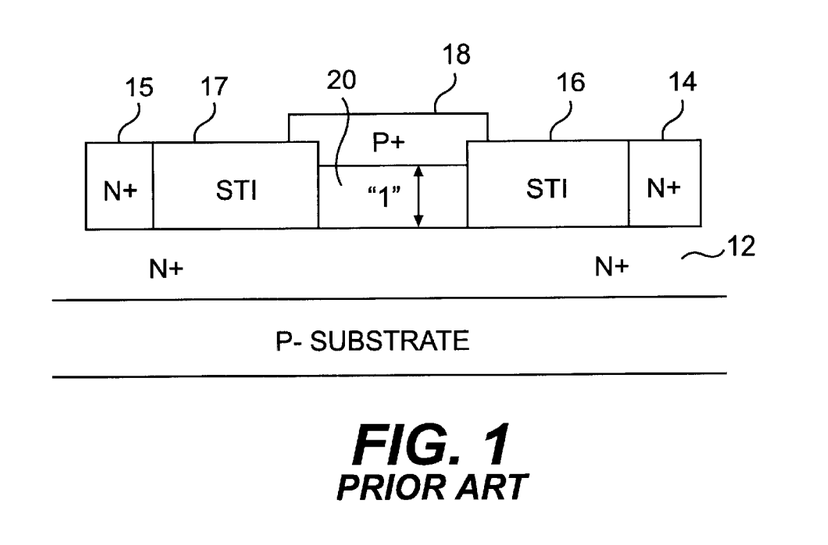
FIG. 1 illustrates the cross-section of a convention prior art PIN diode.

FIG. 1 illustrates a cross-section of a PIN diode semiconductor device. The device represented in the figure includes a continuously doped subcollector or cathode layer 12 deposited on the substrate 11 having a P-doping. The N+ doping level for the subcollector/cathode is preferably greater than 1e20 cm−3. An implant region 14, 15 around the periphery of the PIN diode provides an external connection to the subcollector/cathode 12. Shallow trench isolation (STI) structures 16, 17 are shown inside of the cathode implant region 14 and 15. The STI structures 16, 17 effectively isolate the anode 18 from the cathode connection implants 14 and 15 and confine charge flow to the vertical direction. The result is an essentially vertical PIN diode, wherein conduction takes place between the anode 18 and subcollector/cathode 12 within the intrinsic undoped region 20.

The performance of the vertical PIN diode illustrated in FIG. 1 at high frequencies is limited by the amount of charge which may be stored in the intrinsic undoped region 20. At high radio frequencies, the more charge stored within the intrinsic undoped region 20, the more difficult it is to either turn off or turn on the PIN diode, i.e. render non-conducting or render conducting, providing linearity when large amplitude radio frequency signals are applied to the PIN diode. The slower switching speed of the PIN diode maintains the diode in either its on or off state in the face of large amplitude swings of the radio frequency signal.

The present invention is directed to increasing the volume of the intrinsic undoped region 20, so as to permit higher frequency signals at higher amplitudes to be switched by the PIN diode without changing the conduction state for the diode. The technique does not involve increasing the thickness of the epitaxial Si layer maintaining integratability with other devices.

Figure 2:
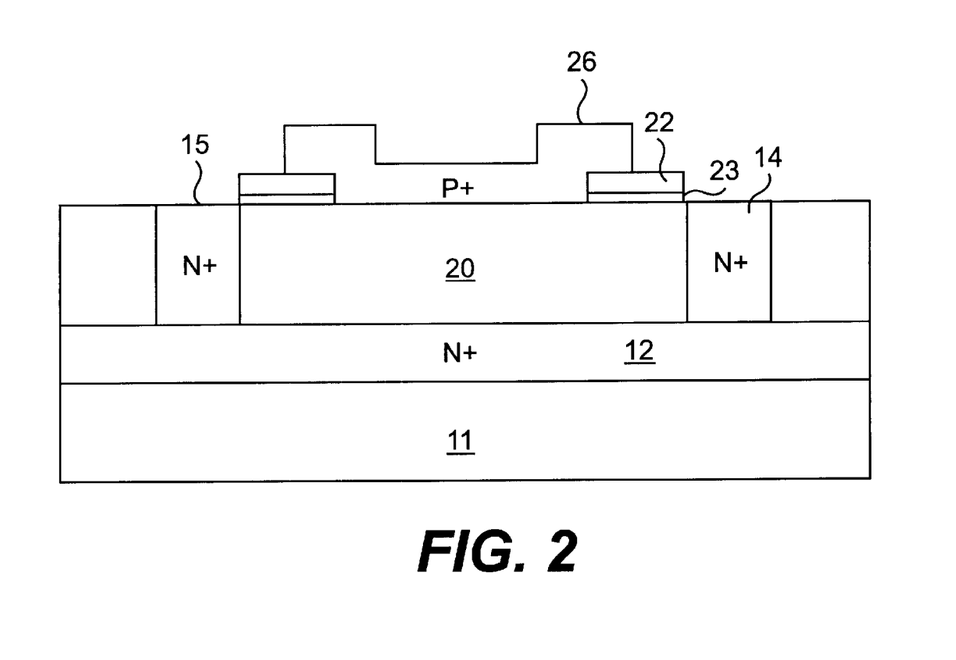
FIG. 2 represents a PIN diode in accordance with a first aspect of the invention.

Referring now to FIG. 2, one illustration of a lateral PIN diode is shown wherein the intrinsic undoped region 20 volume has been increased over the vertical pin diode of FIG. 1. The lateral PIN diode of FIG. 2 avoids the use of the shallow trench insulation structure, thus increasing the volume of the intrinsic undoped region 20. The removal of the STI structures permits lateral electron and hole migration between the collector cathode 12, connection implants 14, 15, and the anode 26. The anode 26 is separated from each of the connection implants 14 and 15 by insulation layers 22, 23. Insulation layers 22, 23 may be an oxide, or combination of oxide/nitride layers used in the manufacture of other semiconductor devices on the silicon substrate 11.

Figure 3A:
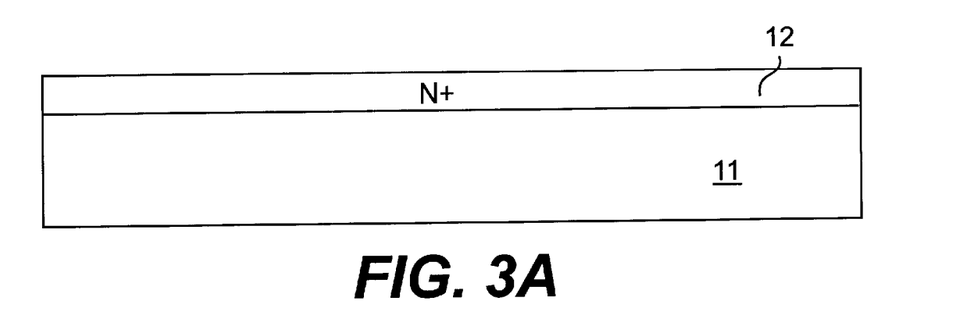
FIG. 3a is the beginning process step for forming a subcollector/cathode for the PIN diode.
Figure 3B:
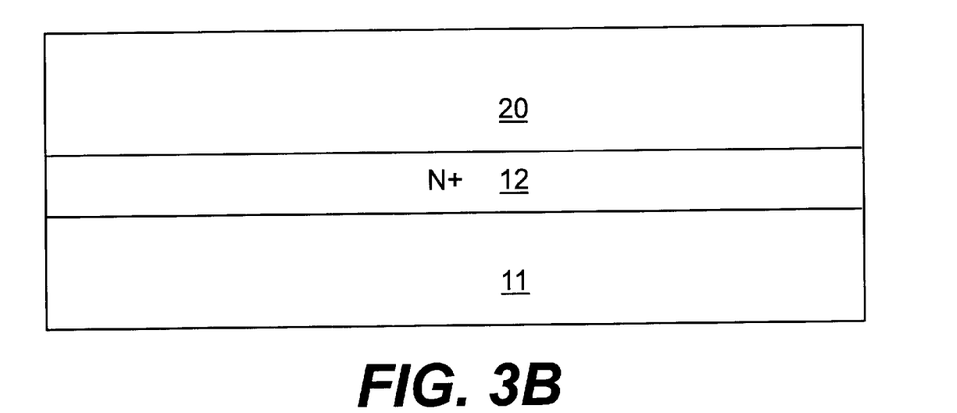
FIG. 3b illustrates the step of providing a Si epi layer over the subcollector/cathode region.

The process steps for implementing the PIN diode embodiment of FIG. 2 are shown more completely in FIGS. 3a, 3b, 3c and 3d. Referring now to FIG. 3a, the process of forming the subcollector/cathode 12 on substrate 11 is shown. The subcollector/cathode 12 is created by implanting the substrate 11 surface with phosphorus, or antimony, to derive the N+ concentration of preferably greater than 1e20 cm−3. An undoped silicon Si epi layer 20 is grown over the cathode 12 which later becomes the undoped intrinsic region 20 to a layer thickness of approximately 0.5 µm.

Figure 3C:
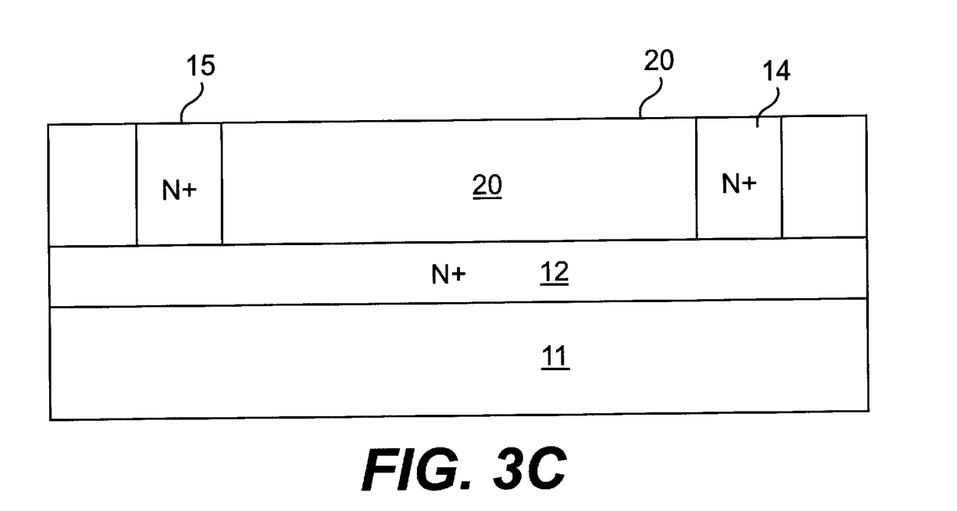
FIG. 3c illustrates the step of forming implanted subcollector contacts cathode extensions.

FIG. 3c illustrates the step of implanting cathode connections 14 and 15. Following masking of the surface of the Si epi layer, an implant, shown as 14 and 15 is created to connect the subcollector/cathode 12 to the surface. Doping levels for the implants are preferably greater than 1e18 cm−3, and may be phosphorus and/or antimony. The implants 14, 15 are created through a mask which may form a circumferential enclosure, wherein 14, 15 represent a section view of the implant area enclosing a intrinsic undoped region 20.

Figure 3D:
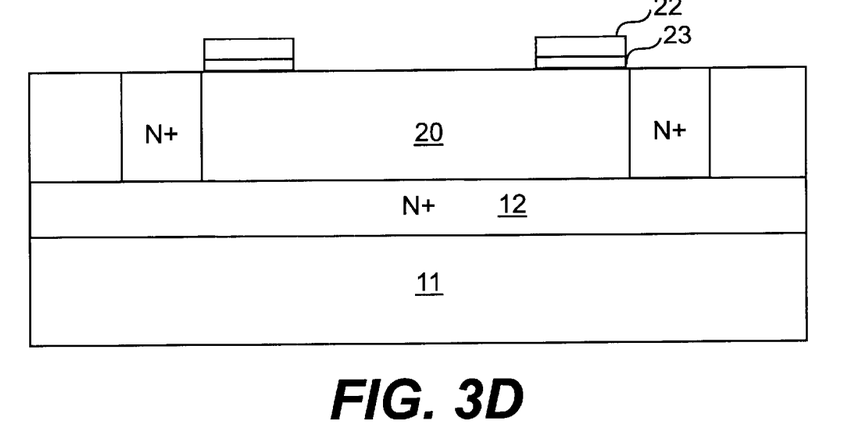
FIG. 3d illustrates the step of forming a dielectric insulation on the SI epi layer prior to depositing the anode contact.

FIG. 3d illustrates the formation of dielectric insulation layers which are deposited through a mask structure over the intrinsic undoped region 20. The dielectric insulation layers 22, 23 provide spacing for an anode contact 26 which is grown over the intrinsic undoped region 20, maintaining the anode contact 26 isolated from the connection implant 14, 15. The dielectric insulation layers passivate the exposed surfaces between the subcollector/cathode implant 14, 15 contact, and a P+ anode 26. The P+ anode 26 may then be grown through a mask over the intrinsic undoped region 20 and insulation layers 22, 23. The doping level for the anode 26 contact is preferably greater than 1e19 atoms per cm−3.

The resulting structure of FIG. 2 provides a lateral PIN diode wherein hole and electron conduction occurs between the anode contact 26, and implants contact 14, 15 and subcollector/cathode 12. The increased volume of the intrinsic undoped region 20 is increased in volume over the vertical PIN diode, by having the intrinsic undoped region 20 extend into regions formerly occupied by the STI structure of the prior art.

FIG. 4 illustrates another lateral diode embodiment in accordance with the principles used to fabricate the embodiment of FIG. 3. The embodiment of FIG. 4 is different, in that the subcollector 12 has been formed in the shape of a cylindrical enclosure, having an interior open portion 28. Subcollector/cathode 12 has an interior perimeter 12 connected by an N-skin 30. The N-skin 30 resides along the substrate epi interface. Thus, it is displaced from the top surface of the subcollector/cathode 12 thereby extending the depth of the intrinsic undoped region 20. The increased depth adds charge volume to the intrinsic undoped region thereby improving its performance for high frequency signals. The N-skin 30 is formed in the region surrounded by the subcollector/cathode 12, and constitutes part of the collector/cathode 12. Accordingly, the resulting increased volume of the intrinsic region 20 provides the foregoing advantages of a higher charge storage capacity over the prior art PIN diode of FIG. 1.

Figure 4A:
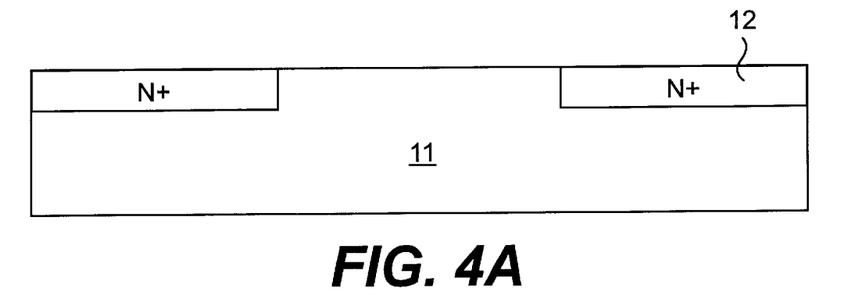
FIGS. 4A–4D illustrates in accordance with another aspect of the invention a PIN diode having a high volume intrinsic region.
Figure 4B:
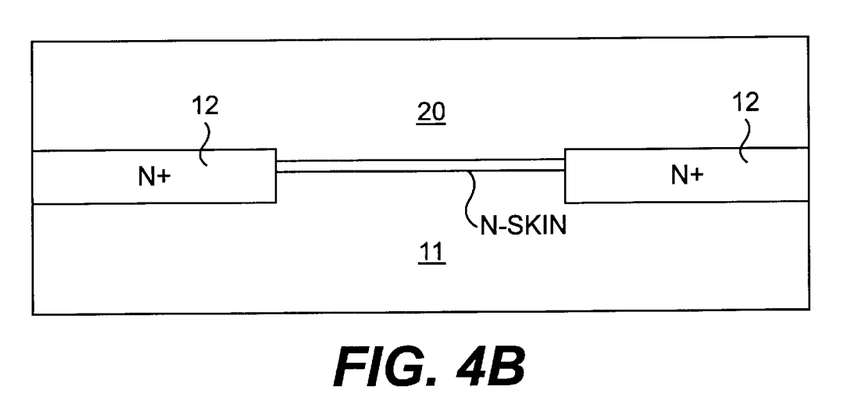

FIG. 4a illustrates the step for patterning the subcollector to produce the interior peripheral region 29 which will be occupied by the N-skin. The patterned subcollector 12 is implanted with a concentration of arsenic or phosphorus which is preferably greater than 1e20 cm−3. As FIG. 4b shows, when the Si epi layer is grown, the N-skin is formed by a lateral out diffusion of N-type dopants from the N+ subcollector region 12. Since the top surface of the N+ subcollector diffuses upward unavoidably during the deposition of the Si epi layer (typically 0.25–0.5 µm), the N-skin as noted with respect to FIG. 4 has a depth from the surface of the Si epi surface greater than the subcollector 12 depth, thereby increasing the volume available for the intrinsic undoped region 20.

Figure 4C:
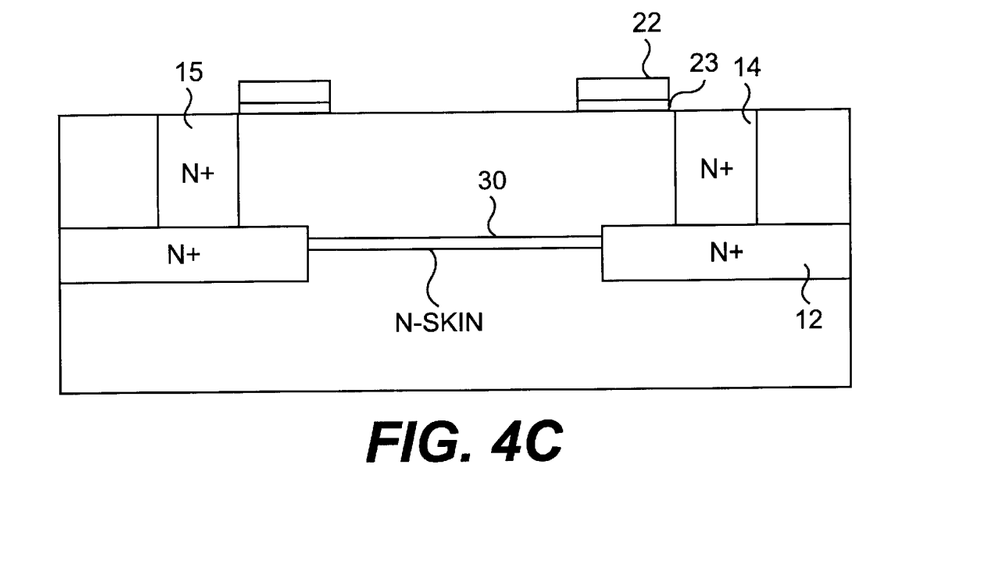
Figure 4D:
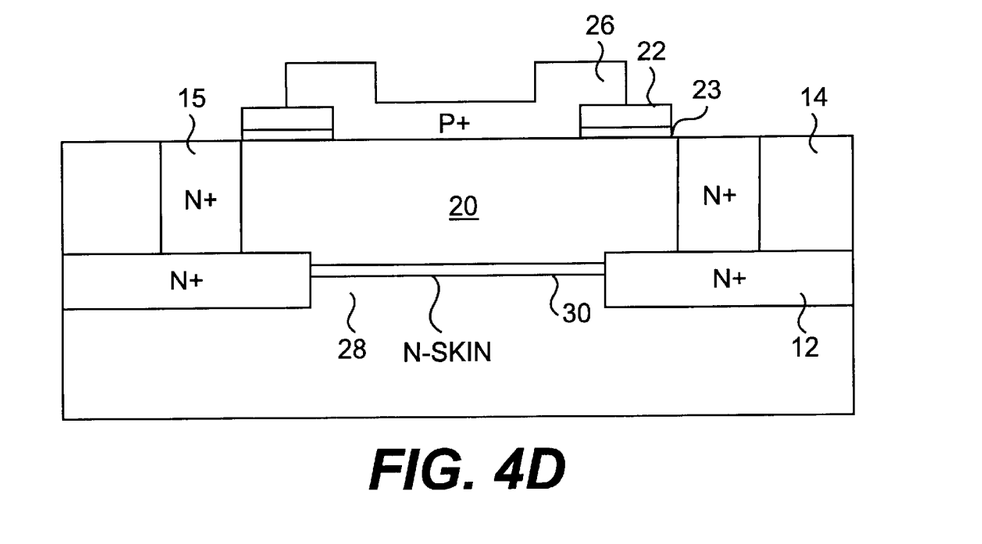

The remaining steps for completing the lateral diode of FIG. 4 are identical to those in FIGS. 3c, wherein the subcollector/cathode implants are formed through masks on the surface of the undoped SI epi layer 20, followed by formation of the insulation layers 22, 23 which may be of oxide/nitride layers of FIG. 4c. The P+ anode contact 26 is grown over the insulation layers 22, 23 in contact with the intrinsic undoped region 20. Thus, the volume for the intrinsic undoped region has been increased in two dimensions, in both depth and width over that of FIG. 1.

Figure 5:
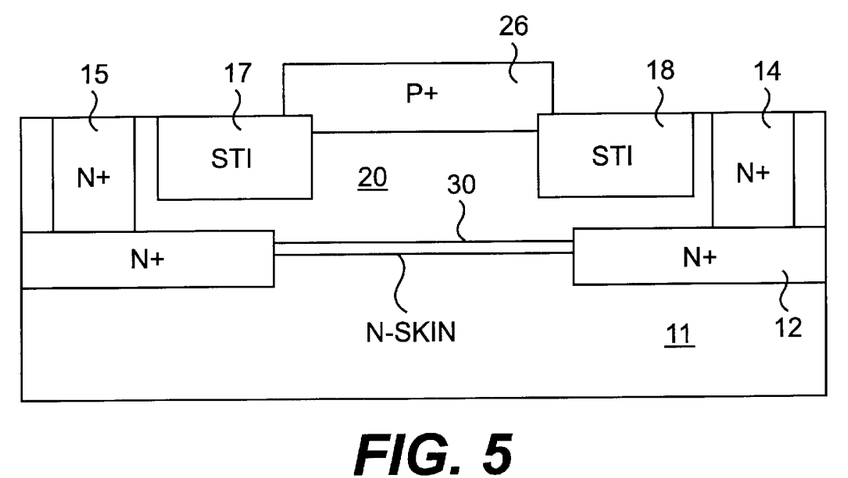
FIG. 5 illustrates a vertical PIN diode in accordance with another aspect of the invention.
Figure 5A:
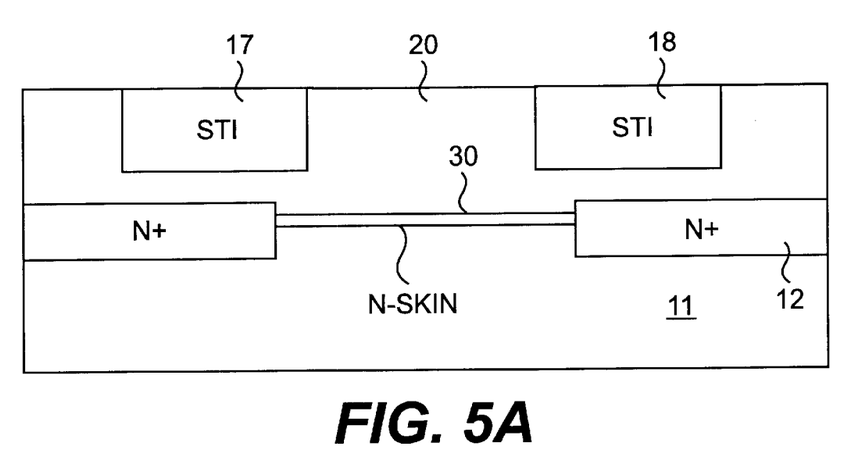
FIG. 5a illustrates the step for forming shallow trench isolation structures in the vertical PIN diode.
Figure 5B:
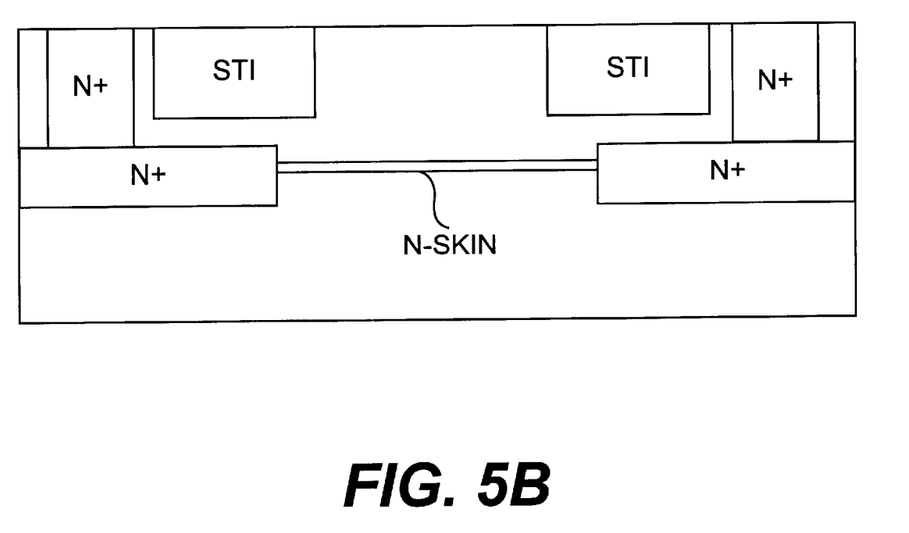
FIG. 5b illustrates the formation of the implanted subcollector contacts in the vertical PIN diode.

The foregoing principles may be applied to a PIN diode having a vertical orientation. Referring now to FIG. 5, a vertical PIN diode is shown which includes the N-skin 30 interconnecting the inner periphery of subcollector/cathode 12 to form a interior portion of the subcollector/cathode 12. The STI structures 16, 17 are implemented as shown in FIG. 5a, using existing prior art structures where a hole is created in the SI epi layer 20 and filling it with $SIO_2$. The STI structures 16, 17 may be in the form of a ring, enclosing the intrinsic undoped region 20, keeping carriers from moving between the collector/cathode implant connections 14, 15 and the anode 26. The implant connections to the collector/cathode 12 are formed according to FIG. 5b, with a doping level preferably greater than 1e18 cm−3.

An anode 26 is formed as is conventional in PIN diode structure to straddle the STI structure and provide a large contact area with the intrinsic undoped region 20. Doping levels for the P+ anode 26 are preferably greater than 1e19 atoms/cm−3.

The resulting structure is a vertical diode which produces conduction between the N-skin and anode contact 26 in a substantially vertical orientation. The STI structure 14, 15 substantially suppresses any lateral conduction between the anode 26 and implant connections 14 and 15.

Thus, there has been described several techniques for increasing the volume of the intrinsic undoped region in a PIN diode. These methods can be used in processes for creating both lateral PIN diodes and vertical PIN diodes having a increased intrinsic undoped region volume.

Additionally, the fabrication techniques for creating these devices permit PIN diodes to be built along with CMOS or bipolar transistor devices, using a common manufacturing process.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A microwave PIN diode comprising:
   a semiconductor substrate having an implanted N+ subcollector region, patterned to enclose a region which has an N-skin layer defining a lower level of an intrinsic region of said PIN diode;
   an Si layer formed over said subcollector region and said N-skin layer, having a thickness which exceeds a desired intrinsic region of said PIN diode;
   a cathode contact implanted in said Si layer which contacts said subcollector cathode region;
   a shallow trench isolation structures disposed in said Si layer extending towards said implanted subcollector region for preventing the lateral migration of carriers in said intrinsic region towards said cathode contact implant; and
   a P+ anode contact extending between said first and second isolation structures, a bottom surface of said P+ contact and a top surface of said N-skin layer defining an intrinsic undoped region for said PIN diode.

2. The microwave PIN diode according to claim 1 wherein P+ anode contact has a doped level greater than 1E 19 atoms/cm−3.

3. The microwave PIN diode according to claim 2 wherein said anode contacts are implanted in said Si layer at a doping level greater than 1E18 cm−3.

4. The microwave PIN diode according to claim 2 wherein said subcollector region has a doping concentration level greater than 1E 20 cm−3 to permit the formation of said N-skin layer between said implants.

5. The microwave PIN diode according to claim 1 wherein said N-skin layer is located further from said anode contact than said subcollector/cathode, thereby expanding the volume of said intrinsic undoped region.

6. The microwave PIN contact according to claim 1 wherein said subcollector/cathode is in the form of a cylinder extending from the surface of said intrinsic undoped region to said subcollector/cathode.

7. A semiconductor microwave PIN diode comprising:
   a P-substrate;
   an implant patterned N+ subcollector/cathode region in said P-substrated enclosing a portion of said substrate;
   said enclosed portion having an N-skin which makes contact with the edges of said subcollector/cathode region;
   an undoped Si epi layer formed over said subcollector region and N-skin;
   an implanted N+ subcollector/cathode contact formed in said Si epi layer in contact with said subcollector layer;
   a dielectric insulation formed adjacent said implanted subcollector contact which passivates an exposed surface of said Si epi layer adjacent said subcollector/cathode contact; and
   an anode contact formed over said dielectric insulation and separated from said subcollector contact by said dielectric insulation, whereby an intrinsic region is formed between said N-skin region and said anode contact which provides lateral carrier movement between said anode contact and said collector/cathode contact.

8. The microwave PIN diode according to claim 7 wherein said subcollector/cathode contact is formed in the shape of a cylinder extending from the surface of said Si epi layer to said subcollector/cathode layer.

9. The microwave PIN diode according to claim 7 wherein said dielectric insulation comprises multiple layers of an oxide and nitride layers.

10. The microwave PIN diode according to claim 7 wherein said N-skin has a depth greater than the depth of said subcollector/cathode thereby increasing the volume of said intrinsic undoped region.

11. A semiconductor microwave PIN diode comprising:
    a P-substrate;
    an implanted N+ subcollector/cathode layer on said P-substrated;
    an undoped Si epi layer formed over said subcollector region;
    an implanted N+ subcollector/cathode contact formed in said Si epi layer in contact with said subcollector/cathode layer;
    a dielectric insulation layer formed adjacent said implanted subcollector contact which passivates an exposed surface of said Si epi layer adjacent said subcollector/cathode contact; and
    an anode contact formed in contact with said Si layer and over said dielectric insulation which separates said anode contact from said subcollector, whereby an intrinsic region is formed between said N-skin region and said anode contact which provides lateral carrier movement between said anode contact and said collector/cathode contact.

12. The microwave PIN diode according to claim 11 wherein said subcollector/cathode contact is formed in the shape of a cylinder extending from the surface of said Si epi layer to said subcollector/cathode layer.

13. The microwave PIN diode according to claim 10 wherein said dielectric insulation comprises multiple layers of an oxide and nitride layers.

* * * * *

UNITED STATES PATENT AND TRADEMARK OFFICE
Certificate

Patent No. 6,429,500                                                          Patented: August 6, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: David R. Greenberg, White Plains, NY; Kathryn T. Schonenberg, New Fairfield, CT; Seshardri Subbanna, Brewster, Walkill, NY; Keith M. Walter, Walkill, NY; and Dale K. Jadus, Wappingers Falls, NY.

Signed and Sealed this Fourth Day of March 2003.

AMIR ZARABIAN
*Supervisory Patent Examiner*
Art Unit 2822